(12) United States Patent
Furudate

(10) Patent No.: US 7,965,079 B2
(45) Date of Patent: Jun. 21, 2011

(54) MAGNETIC RESONANCE IMAGING APPARATUS AND MAGNETIC RESONANCE IMAGING METHOD

(75) Inventor: Naoyuki Furudate, Otawara (JP)

(73) Assignees: Kabushiki Kaisha Toshiba, Tokyo (JP); Toshiba Medical Systems Corporation, Tochigi-Ken (JP)

( * ) Notice: Subject to any disclaimer, the term of this patent is extended or adjusted under 35 U.S.C. 154(b) by 206 days.

(21) Appl. No.: 12/481,089

(22) Filed: Jun. 9, 2009

(65) Prior Publication Data

US 2009/0309592 A1 Dec. 17, 2009

(30) Foreign Application Priority Data

Jun. 16, 2008 (JP) ................................. 2008-156903
Apr. 9, 2009 (JP) ................................. 2009-095090

(51) Int. Cl.
*G01V 3/00* (2006.01)

(52) U.S. Cl. ...................................... 324/306; 324/309

(58) Field of Classification Search .................. 324/306, 324/309
See application file for complete search history.

(56) References Cited

U.S. PATENT DOCUMENTS

| 5,417,214 A | * | 5/1995 | Roberts et al. | ................ | 600/413 |
| 7,071,689 B2 | * | 7/2006 | Golay et al. | .................. | 324/309 |
| 7,880,464 B2 | * | 2/2011 | Yamada et al. | ............... | 324/306 |

FOREIGN PATENT DOCUMENTS

JP 2003-144416 A 5/2003

* cited by examiner

*Primary Examiner* — Louis M Arana
(74) *Attorney, Agent, or Firm* — Knoble Yoshida & Dunleavy, LLC

(57) ABSTRACT

A magnetic resonance imaging apparatus includes a fluid image data acquisition unit and a flow velocity measuring unit. The a fluid image data acquisition unit acquires fluid image data, corresponding to mutually different inversion times, by imaging with applying at least three inversion recovery pulses having the inversion times. The flow velocity measuring unit obtains a flow velocity of fluid based on time variation of a signal intensity depending on the inversion times at each of plural positions and a distance between the plural positions.

13 Claims, 8 Drawing Sheets

MAGNETIC RESONANCE IMAGING APPARATUS AND MAGNETIC RESONANCE IMAGING METHOD

BACKGROUND OF THE INVENTION

1. Field of the Invention

The present invention relates to a MRI (magnetic resonance imaging) apparatus and a magnetic resonance imaging method which excite nuclear spin of an object magnetically with a RF (radio frequency) signal having the Larmor frequency and reconstruct an image based on NMR (nuclear magnetic resonance) signals generated due to the excitation, and more particularly, to a magnetic resonance imaging apparatus and a magnetic resonance imaging method which make it possible to measure a flow velocity of fluid.

2. Description of the Related Art

Magnetic Resonance Imaging is an imaging method which excites nuclear spin of an object set in a static magnetic field with a RF signal having the Larmor frequency magnetically and reconstruct an image based on NMR signals generated due to the excitation.

The PS (phase shift) method has been used commonly as a measuring method of a blood flow velocity in the field of magnetic resonance imaging. The PS method also called the phase contrast MRA (magnetic resonance angiography) is one of the MRA imaging methods which images blood flow based on the phase information of spins (see, for example, Japanese Patent Application (Laid-Open disclosure) No. 2002-165771). Specifically, when the gradient magnetic field is applied as a bipolar gradient, the phase of the static spins does not change over the application of the gradient magnetic field but the phase of the moving spins in blood flow shifts over the application of the gradient magnetic field. The phase shift of the spins depends on the intensity of the applied gradient magnetic field, the application period and the spin velocity. The blood flow velocity and the blood flow direction can be calculated based on the phase information of the spins using this relation.

In addition, the t-SLIP (Time-SLIP: Time Spatial Labeling Inversion Pulse) method has been known in the field of magnetic resonance imaging as one of the non-contrast-enhanced MRA methods that can selectively depict a blood vessel image without a contrast medium. In the t-SLIP method, the t-SLIP pulse for labeling is applied in accordance with the t-SLIP sequence and blood flowing into an imaging area is labeled. That is, the t-SLIP sequence is an imaging sequence with applying an ASL (arterial spin labeling) pulse for tagging blood flowing into an imaging section so that the tagged blood is selectively imaged or suppressed. According to this t-SLIP sequence, the signal intensities of only blood reaching the imaging section after the TI (inversion time) can be selectively emphasized or suppressed. By setting the spatial position where the t-SLIP pulse is applied and the TI corresponding to the waiting time from an application timing of the t-SLIP pulse to an imaging properly, various blood vessels can be selectively imaged and suppressed. Moreover, a technique that performs a pre-scan called the TI-prep, for acquiring data with a gradual TI change, prior to an imaging scan under the t-SLIP method has been designed as a method to acquire the optimum TI in the case where the spatial position where the t-SLIP pulse is applied is fixed (see, for example, Japanese Patent Application (Laid-Open disclosure) No. 2003-70766).

However, when a flow velocity is measured by the conventional PS method, a complicated work that the ROI (region of interest) is set to specify the position of a fluid to be measured is needed.

Especially, the PS method is a technique to image the phase difference of signals. Therefore, PS method can not acquire a blood vessel image with an improved contrast compared with a technique to image the intensity difference of signals. Consequently, there is a problem that searching for the blood vessel to be a measurement target of the flow velocity in a blood vessel image acquired by the PS method is difficult. In addition, there is a problem that the imaging time becomes long in case where a flow velocity is measured by the conventional PS method.

Meanwhile, when imaging is performed by the t-SLIP method, a blood flow velocity is required as an imaging condition. For this reason, prior to an imaging by the t-SLIP method, the development of method to acquire a flow velocity of a fluid such as a blood flow more easily in a shorter time is required.

SUMMARY OF THE INVENTION

The present invention has been made in light of the conventional situations, and it is an object of the present invention to provide a magnetic resonance imaging apparatus and a magnetic resonance imaging method which make it possible to measure a flow velocity of fluid more easily in a shorter time.

The present invention provides a magnetic resonance imaging apparatus comprising: a fluid image data acquisition unit configured to acquire plural pieces of fluid image data from an object by imaging with applying at least three inversion recovery pulses having mutually different inversion times, the plural pieces of the fluid image data corresponding to the inversion times; and a flow velocity measuring unit configured to obtain a flow velocity of fluid based on time variation of a signal intensity depending on the inversion times at each of plural positions set in at least one of the plural pieces of the fluid image data and a distance between the plural positions, in an aspect to achieve the object.

The present invention also provides a magnetic resonance imaging method comprising: acquiring plural pieces of fluid image data from an object by imaging with applying at least three inversion recovery pulses having mutually different inversion times, the plural pieces of the fluid image data corresponding to the inversion times; and obtaining a flow velocity of fluid based on time variation of a signal intensity depending on the inversion times at each of plural positions set in at least one of the plural pieces of the fluid image data and a distance between the plural positions, in an aspect to achieve the object.

The magnetic resonance imaging apparatus and the magnetic resonance imaging method according to the present invention as described above make it possible to measure a flow velocity of fluid more easily in a shorter time.

DESCRIPTION OF THE PREFERRED EMBODIMENTS

A magnetic resonance imaging apparatus and a magnetic resonance imaging method according to embodiments of the present invention will be described with reference to the accompanying drawings.

(Configuration and Function)

Figure 1:
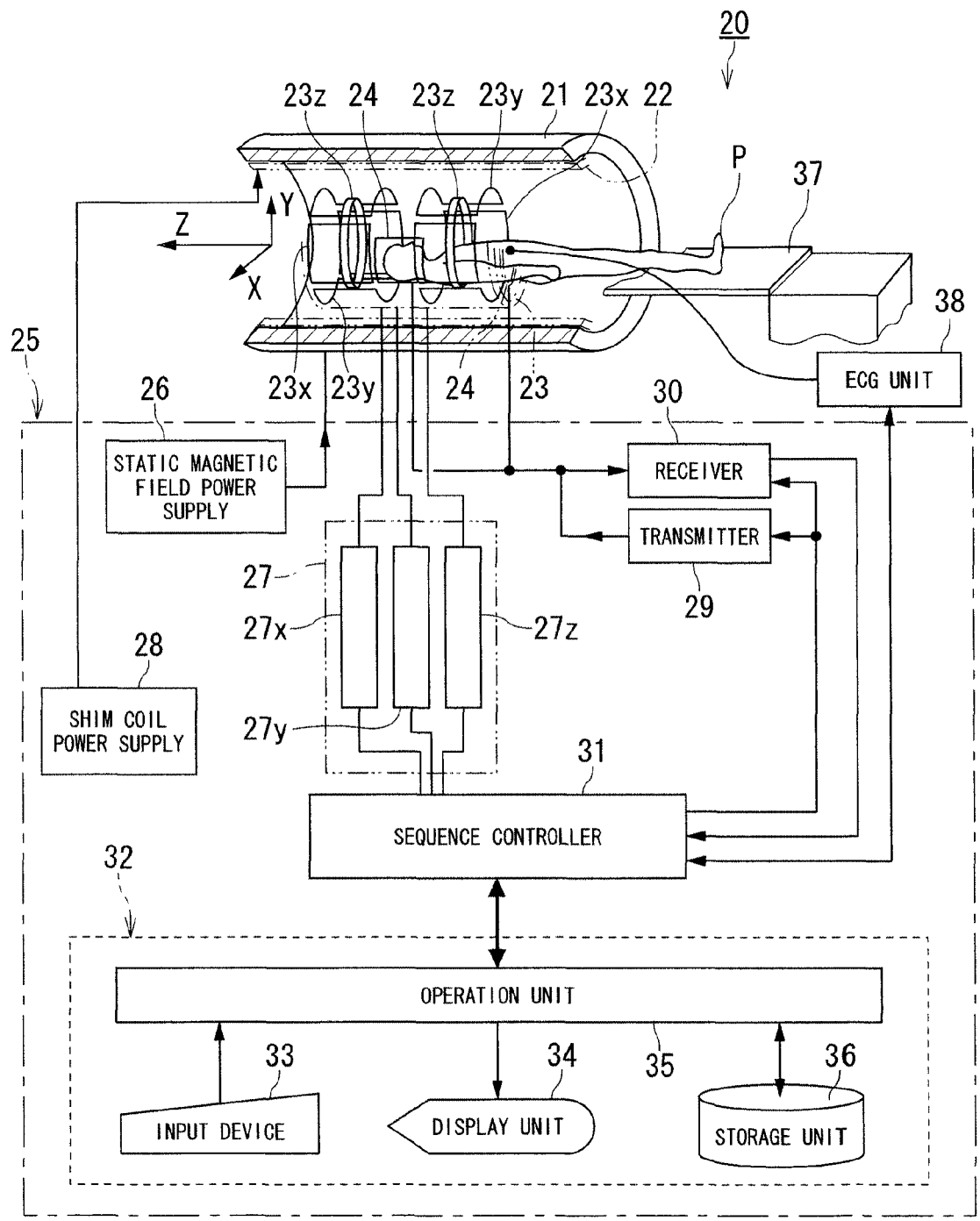
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and RF coils 24.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, a operation unit 35 and a storage unit 36.

The static field magnet 21 communicates with the static magnetic field power supply 26. The static magnetic field power supply 26 supplies electric current to the static field magnet 21 to get the function to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. The RF coils 24 include a whole body coil (WBC: whole body coil), which is built in the gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 has a function to transmit a RF signal given from the transmitter 29 to the object P. The reception RF coil 24 has a function to receive a MR signal generated due to an nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27

The sequence controller 31 is also configured to give raw data to the computer 32. The raw data is complex data obtained through the detection of a NMR signal and A/D (analog to digital) conversion to the NMR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a NMR signal given from the RF coil 24 and performing predetermined signal processing and A/D converting to the NMR signal detected. The receiver 30 also has a function to give the generated raw data to the sequence controller 31.

In addition, an ECG unit 38 for acquiring an ECG (electro cardiogram) signal of the object P is provided with the magnetic resonance imaging apparatus 20. The ECG signal detected by the ECG unit 38 is outputted to the computer 32 through the sequence controller 31.

Note that, a PPG (peripheral pulse gating) signal may be acquired instead of an ECG signal. A PPG signal is acquired by detecting a pulse wave of e.g. tip of a finger as an optical signal. When a PPG signal is acquired, a PPG signal detection unit is provided with the magnetic resonance imaging apparatus 20.

The computer 32 gets various functions by the operation unit 35 executing some programs stored in the storage unit 36 of the computer 32. Alternatively, some specific circuits having various functions may be provided with the magnetic resonance imaging apparatus 20 instead of using some of the programs.

Figure 2:
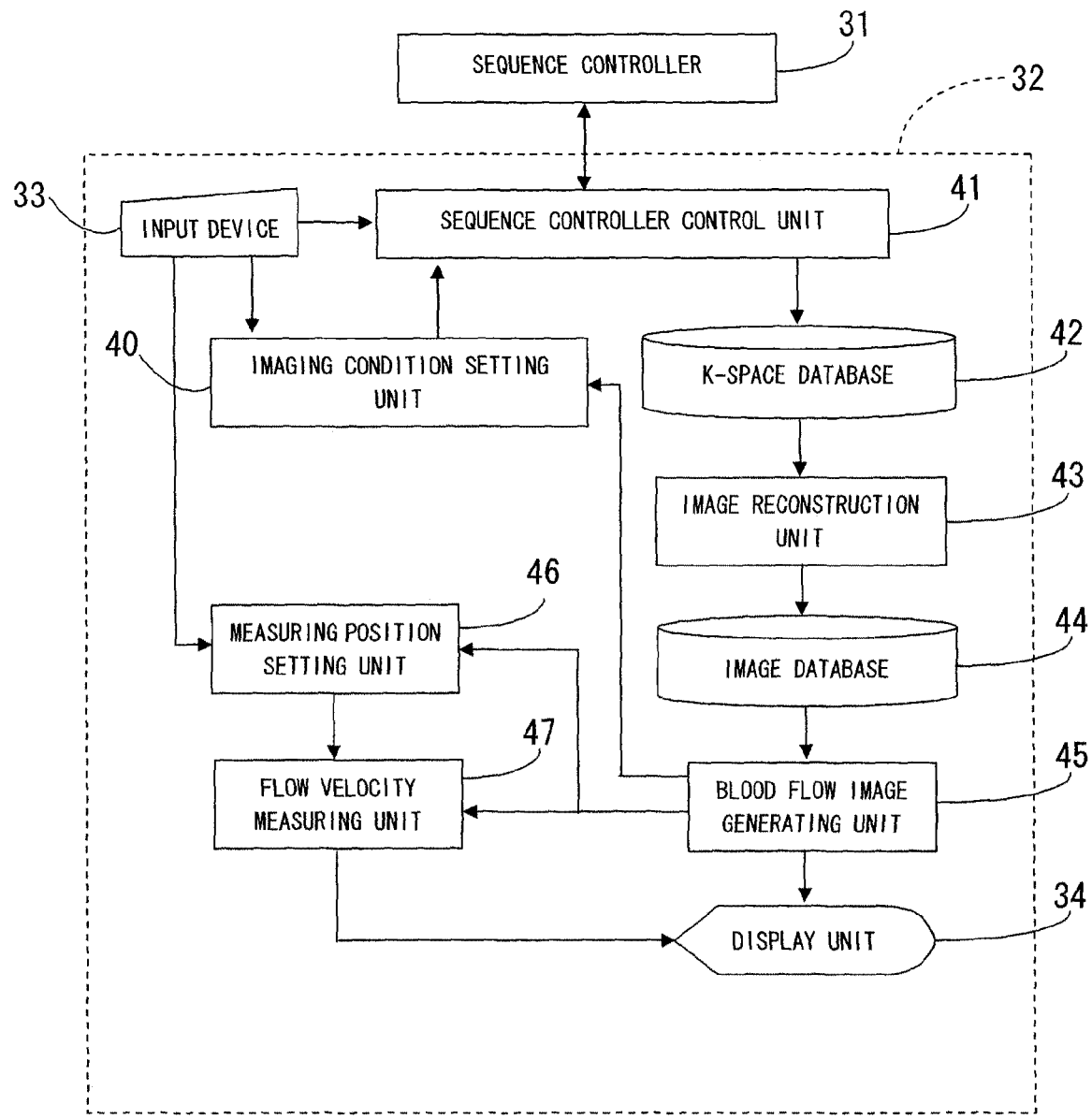
FIG. 2 is a functional block diagram of the computer shown in FIG. 1.

FIG. 2 is a functional block diagram of the computer 32 shown in FIG. 1.

The computer 32 functions as an imaging condition setting unit 40, a sequence controller control unit 41, a k-space database 42, an image reconstruction unit 43, an image database 44, a blood flow image generating unit 45, a measuring position setting unit 46 and a flow velocity measuring unit 47 by program.

The imaging condition setting unit 40 has a function to set an imaging condition including a pulse sequence based on instruction from the input device 33 and to provide the set imaging condition to the sequence controller control unit 42. Especially, the imaging condition setting unit 40 has the function to set a pulse sequence for acquiring fluid image data such as blood flow image data with applying at least three IR (inversion recovery) pulses with mutually different TIs in order to acquire a flow velocity of a fluid such as blood flow. Hereinafter, a case of acquiring blood flow image data will be described, the same holds for a case of acquiring other fluid image data.

Figure 3:
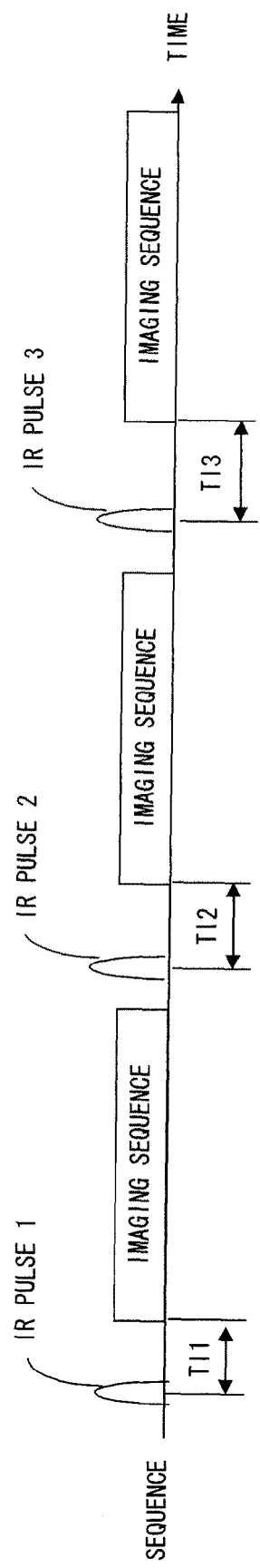
FIG. 3 is a conceptual diagram showing an example of a pulse sequence, for measuring a blood flow velocity, set in the imaging condition setting unit shown in FIG. 2.

FIG. 3 is a conceptual diagram showing an example of a pulse sequence, for measuring a blood flow velocity, set in the imaging condition setting unit 40 shown in FIG. 2.

In FIG. 3, the abscissa axis denotes time. As shown in FIG. 3, for example, an imaging sequence for acquiring blood flow data is set after an elapse of a TI1 since the first IR pulse is applied, and subsequently, an imaging sequence for acquiring blood flow data is set after an elapse of a TI2 that is different from the TI1 since the second IR pulse is applied. Moreover, an imaging sequence for acquiring blood flow data is subsequently set after an elapse of a TI3 that is different from any of the TI1 and the TI2 since the third IR pulse is applied. The example in FIG. 3 shows a case where three imaging sequences with applications of IR pulses with mutually different TIs is set. However, more than three imaging sequences with applications of IR pulses with mutually different TIs may be set.

Figure 4:
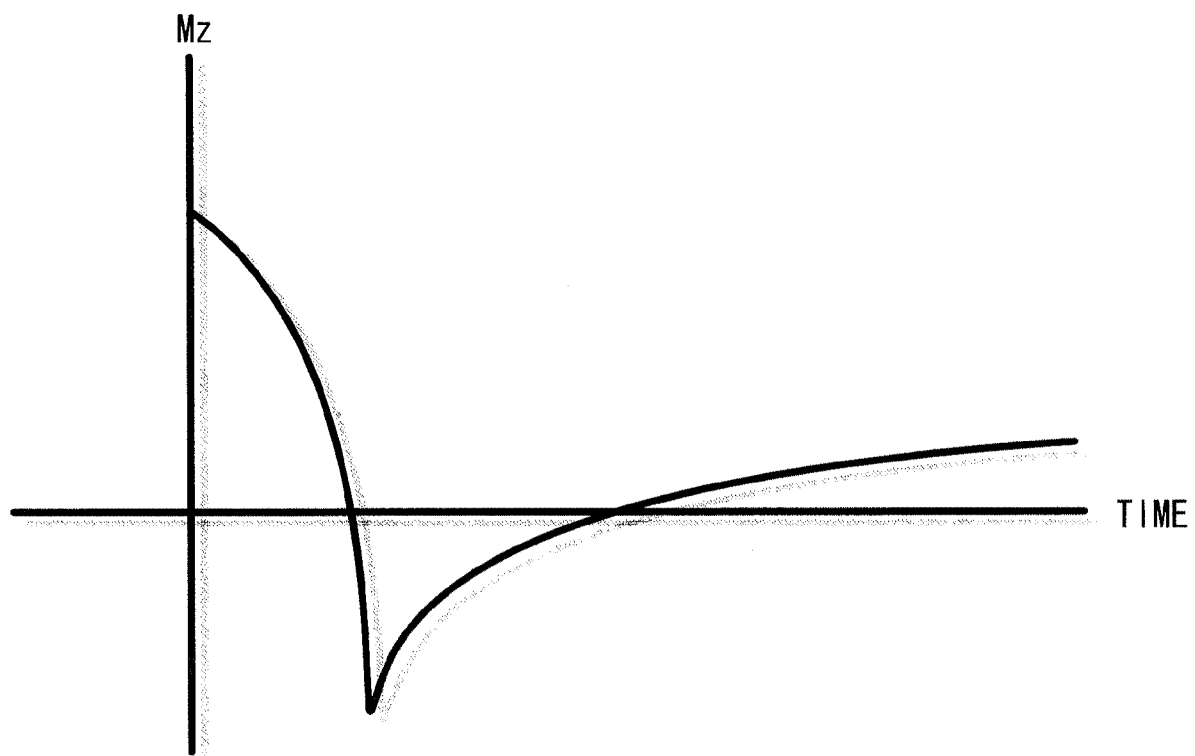
FIG. 4 is a graph showing a change in longitudinal magnetization of spins by applying a IR pulse shown in FIG. 3.

FIG. 4 is a graph showing a change in longitudinal magnetization of spins by applying a IR pulse shown in FIG. 3.

In FIG. 4, the abscissa axis denotes time and the ordinate axis denotes a longitudinal magnetization Mz of the spins. As shown in FIG. 4, a longitudinal magnetization component Mz in a z-axis direction inverts by applying a 180-degrees IR pulse. Afterward, the longitudinal magnetization Mz recovers due to the longitudinal (T1) relaxation. When echo signals are acquired by applying a 90-degrees RF excitation pulse in the imaging sequence during the recovery due to the T1 relaxation, T1 weighted image data can be acquired since a velocity of the recovery from the inversion state of the longitudinal magnetization Mz depends on only the T1. In addition, the T1 weight can be changed to control a contrast by adjusting the TI from the 180-degrees IR pulse to the 90-degrees RF excitation pulse.

Therefore, when multiple pieces of blood flow image data are acquired by application of IR pulses with mutually different TIs, the pieces of blood flow image data show mutually different contrasts depending on the TIs. In addition, when blood flow image data is imaged, a reaching position of blood changes depending on a TI.

An imaging sequence can be set as an arbitrary sequence as long as it can acquire blood vessel image data. However, it is preferable to set respective imaging sequences to a similar kind of sequences so that a difference in contrast condition among pieces of blood flow image data acquired by performing the respective imaging sequences becomes only a TI. Although an imaging sequence can be set as a 3D (three dimensional) sequence. However, in case where the acquired blood flow image data itself is not directly used for diagnosis and therefore detailed spatial information thereof is not required, an imaging sequence may be set as a 2D (two dimensional) sequence from the viewpoint of shortening of an imaging time.

Imaging sequences for acquiring blood flow image data include a sequence for the non-contrast-enhanced MRA that does not use a contrast medium as well as a FE (field echo) sequence used for the contrast enhanced MRA to acquire T1 weighted image data with injecting a contrast medium into the object P.

As the non-contrast-enhanced MRA technique, FBI (Fresh Blood Imaging) method that depicts blood vessels satisfactorily by performing an ECG (electro cardiogram) synchronization to capture blood flow with a high flow velocity pumped out from the heart is known. In the FBI method, blood flow image data is acquired as a transverse relaxation (T2) weighted image data by a SE (spin echo) sequence such as a FSE (fast spin echo) sequence or a FASE (fast asymmetric spin echo) sequence using the half Fourier method. The contrast of T2 weighted image data can also be controlled using a transverse magnetization relaxation similarly to a longitudinal magnetization relaxation described above. Note that, when a sequence under the FBI method is set to an imaging sequence, an ECG signal acquired by the ECG unit 38 can be used as a synchronizing signal.

When blood flow image data is generated by performing the pulse sequence for measuring a blood flow velocity shown in FIG. 3, multiple pieces of blood flow image data corresponding to bloods flowing by mutually different distances according to the different TIs can be acquired. Moreover, a blood flow velocity can be calculated based on the multiple pieces of the blood flow image data corresponding to the different TIs and distances which the bloods flowed. The way to calculate a blood flow velocity will be described hereinafter.

Further, in case of performing an additional imaging using the blood flow velocity calculated based on the multiple pieces of blood flow image data corresponding to the different TIs as described below, the imaging condition setting unit 40 is configured to also set a pulse sequence for a scan to be performed subsequently. In this case, the pulse sequences for measuring a blood flow velocity function also as a sequence for a pre-scan to determine an imaging condition of a scan to be performed subsequently.

The scans each using a blood flow velocity as an imaging condition include the foregoing t-SLIP sequence. Therefore, a pulse sequence for measuring a blood flow velocity can be used as a sequence for a pre-scan of a scan with a t-SLIP sequence. In this case, it is often preferable to set the pulse sequence for measuring a blood flow velocity as a 2D sequence from the viewpoint of shortening of an imaging time. Note that, a t-SLIP pulse applied in a t-SLIP sequence is applied after the elapse of a certain delay time from a R wave on an ECG signal, as needed, and an imaging is performed in synchronization with an ECG.

The t-SLIP pulse consists of a region-nonselective inversion pulse and a region-selective inversion pulse. The region-nonselective inversion pulse can be switched between on and off. That is, a t-SLIP pulse includes at least a region-selective inversion pulse, and consists of only a region-selective inversion pulse or both a region-selective inversion pulse and a region-nonselective inversion pulse.

The region-selective inversion pulse can be set independently of an imaging section. When blood flowing into an imaging area is labeled by the region-selective inversion pulse, signal intensities in a part where the blood reaches after the TI become high. Note that, when a region-nonselective inversion pulse is turned off, the signal intensities in a part where the blood reaches after the TI become low. Therefore, a moving direction and/or distance of the blood can be obtained.

Further, in case of imaging by a t-SLIP sequence, an appropriate TI is required as well as a blood flow velocity. Therefore, if the number of mutually different TIs is increased enough and a width of TI change is decreased in the pulse sequences for measuring a blood flow velocity shown in FIG. 3, pieces of blood flow image data corresponding to many TIs can be acquired. Consequently, an appropriate TI can be determined by selecting a piece of blood flow image data showing a satisfactory contrast. That is, if the number of mutually different TIs is increased enough and a TI change width is decreased in pulse sequences for measuring a blood flow velocity, not only a blood flow velocity but an appropriate TI can be acquired as an imaging condition for a scan with a t-SLIP sequence.

Figure 5:
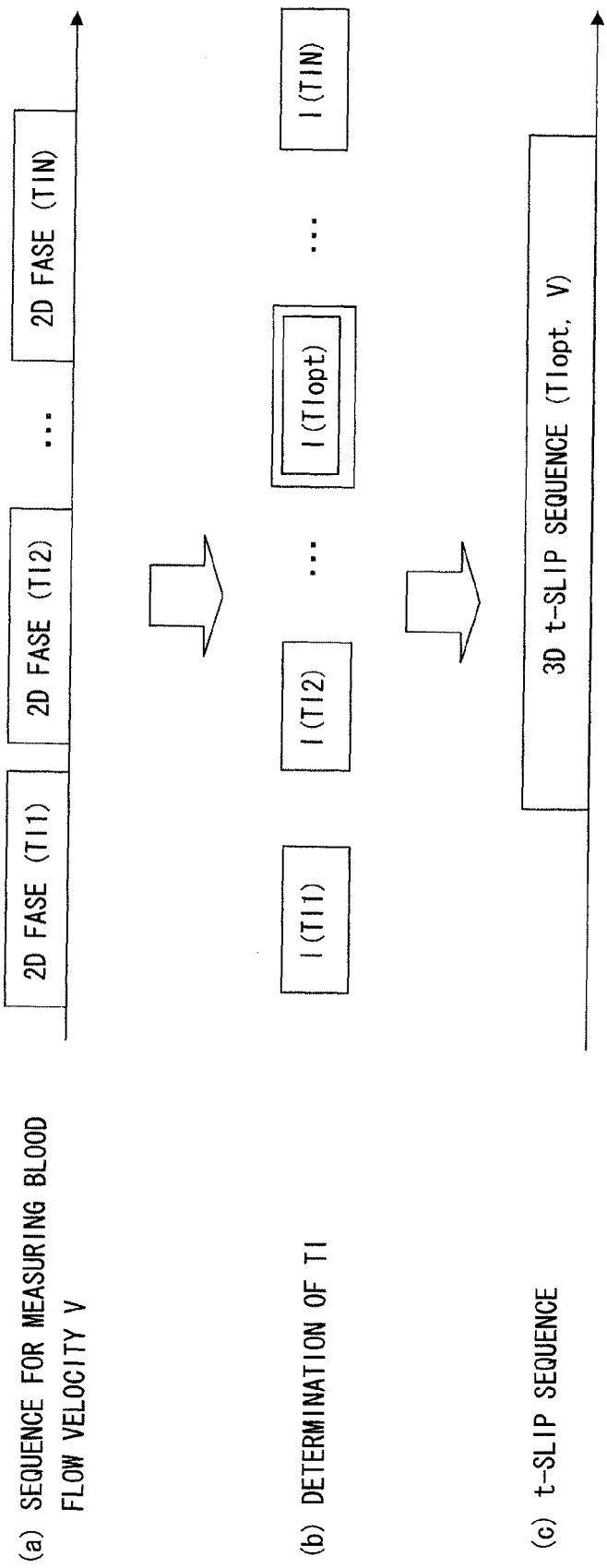
FIG. 5 is a conceptual diagram showing an example of a pulse sequence set for determining a blood flow velocity and an appropriate TI and explaining a method for determining a TI in the imaging condition setting unit shown in FIG. 2.

FIG. 5 is a conceptual diagram showing an example of a pulse sequence set for determining a blood flow velocity and an appropriate TI and explaining a method for determining a TI in the imaging condition setting unit 40 shown in FIG. 2.

As shown in FIG. 5(a), 2D FASE sequences with applying IR pulses with mutually different n TIs (TI1, TI2, . . . , TIN) respectively are set as a pulse sequence for measuring a blood flow velocity, for example. By performing a scan according to the pulse sequence for measuring a blood flow velocity shown in FIG. 5(a), n pieces of blood flow image data I(TI1), I(TI2), . . . , I(TIN) respectively showing mutually different contrasts depending on the respective TIs shown in FIG. 5(b) can be acquired.

Thus, a user can visually select a piece of blood flow image data I(TIopt) with the optimum contrast out of the n pieces of the blood flow image data I(TI1), I(TI2), . . . , I(TIN) with the mutually different contrasts and input selection information to the imaging condition setting unit 40 through the operation of the input device 33. Then, the imaging condition setting unit 40 can acquire an appropriate TIopt corresponding to the selected piece of blood flow image data I(TIopt) from the blood flow image generating unit 45 described below. Alternatively, a pieces of blood flow image data I(TIopt) with the optimum contrast may be selected by image processing in the imaging condition setting unit 40 instead of a user's visual observation.

Meanwhile, a blood flow velocity V is calculated based on the n pieces of blood flow image data I(TI1), I(TI2), . . . , I(TIN) with the mutually different contrasts and mutually different reaching distances of blood in the way described below.

Subsequently, a 3D t-SLIP sequence with the appropriate TIopt and the blood flow velocity V is set as an imaging condition in the imaging condition setting unit 40, and a scan can be performed according to the set 3D t-SLIP sequence.

As described above, a pulse sequence for measuring a blood flow velocity can also be used as a sequence for determining an appropriate TI.

On the other hand, the sequence controller control unit 41 of the computer 32 has a function for controlling the driving of the sequence controller 31 by giving the imaging condition including a pulse sequence, acquired from the imaging condition setting unit 40, to the sequence controller 31, in response to an instruction for scanning start from the input device 33. In addition, the sequence controller control unit 41 has a function for receiving raw data from the sequence controller 31 and arranging the raw data to k space formed in the k-space database 42. Therefore, the k-space database 42 stores the raw data generated by the receiver 30 as k space data. That is, k-space data is arranged in the k-space formed in the k-space database 42.

The image reconstruction unit 43 has a function for reconstructing image data, which is real space data, of the object P by capturing the k-space data from the k-space database 42 and performing image reconstruction processing including FT (Fourier transform) of the k-space data, and writing the generated image data to the image database 44. Therefore, the image database 44 stores the image data reconstructed by the image reconstruction unit 43.

The blood flow image generating unit 45 has a function for generating 2D or 3D blood flow image data and 2D blood flow image data to be displayed by performing image processing such as subtraction processing and/or display processing such as MIP (maximum intensity projection) processing of necessary image data read form the image database 44 and a function for displaying a blood flow image on the display unit 34 by supplying the generated 2D blood flow image data with the display unit 34. Therefore, in the blood flow image generating unit 45, multiple pieces of blood flow image data corresponding to mutually different reaching distances of blood are to be generated with contrasts corresponding to the mutually different plural TIs described above.

Figure 6:
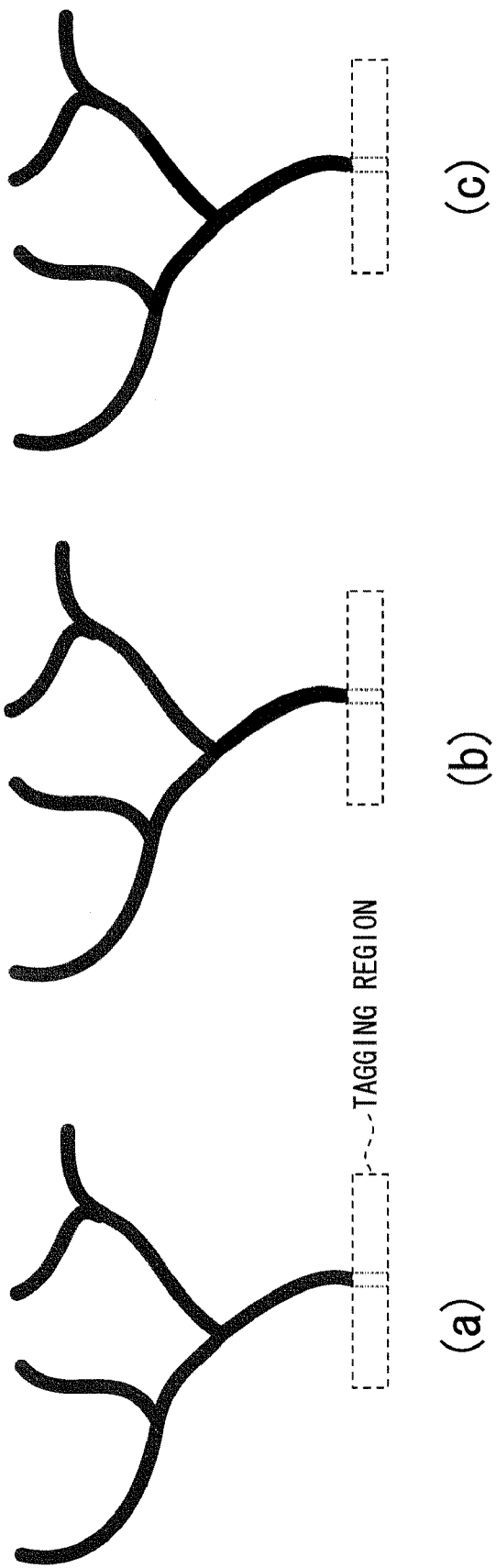
FIG. 6 is a diagram showing an example of plural pieces of blood flow image data, respectively corresponding to mutually different plural TIs, generated by the blood flow image generating unit shown in FIG. 2.

FIG. 6 is a diagram showing an example of plural pieces of blood flow image data, respectively corresponding to mutually different plural TIs, generated by the blood flow image generating unit 45 shown in FIG. 2.

As shown in FIGS. 6 (a), (b) and (c), when a region including the upstream vessel of the target blood vessel is set as a labeling region tagged by the IR pulses and pieces of blood flow image data are generated based on respective echo signals acquired with at least three mutually different TIs, at least three pieces of blood flow image data corresponding to mutually different reaching positions, which depend on the TIs respectively, of blood tagged due to influence by the IR pulses can be acquired. For example, when a region-selective inversion pulse is applied in a tagging region including the upstream vessel and a region-nonselective inversion pulse is also applied by a t-SLIP sequence, blood flow image data indicating white blood can be acquired. That is, a traveling distance of the blood from the tagged region is short in a piece of blood flow image data corresponding to a short TI as shown in FIG. 6(a) while a traveling distance of the blood from the tagged region is moderate in a piece of blood flow image data corresponding to a mid TI as shown in FIG. 6(b). Further, a traveling distance of the blood from the tagged region becomes long in a piece of blood flow image data corresponding to a long TI as shown in FIG. 6(c).

The measuring position setting unit 46 has the function to set plural spatial positions on blood vessels in plural blood flow images displayed on the display unit 34 as measuring positions according to positioning information from the input device 33 such as a mouse and to provide information indicating the set measuring positions to the flow velocity measuring unit 47. When two points are set as multiple measuring positions, measuring position information can be regarded as information indicating a line segment derived by connecting two points. When more than two points are set, measuring position information can be regarded as polygonal line information acquired by connecting the respective points.

Note that, it is preferable that a reference blood flow image to set measuring positions is set to a blood flow image, corresponding to a long TI, on which blood reached to a satisfactory extent from the viewpoint of simplification of measuring position setting. Nevertheless, an arbitrary blood flow image can be used for setting measuring positions. So long as the blood reached on at least one blood flow image, an arbitrary point can be set as a measuring position.

Figure 7:
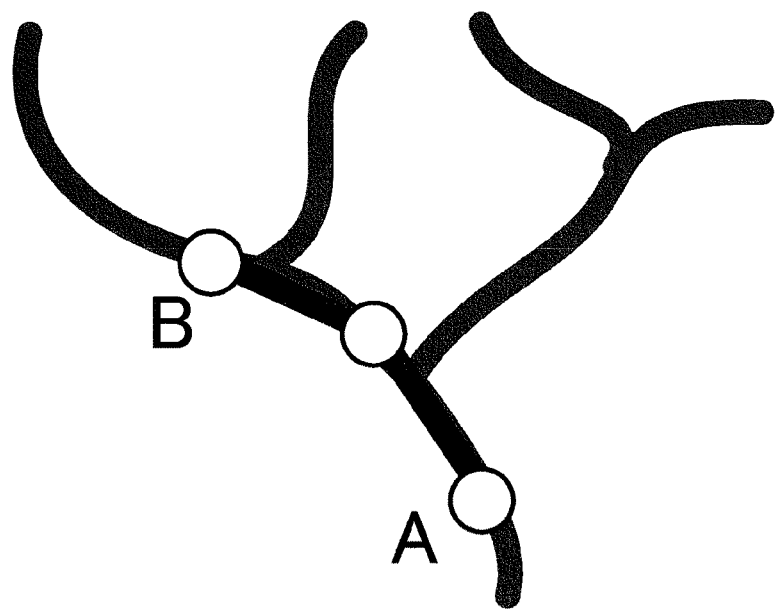
FIG. 7 is a diagram showing an example of measuring positions set on a blood flow image by the measuring position setting unit shown in FIG. 2.

FIG. 7 is a diagram showing an example of measuring positions set on a blood flow image by the measuring position setting unit 46 shown in FIG. 2.

As shown in FIG. 7, measuring position information can be generated as a polygonal line, bending at a single middle point, from a starting point A to an end point B through the operation of the input device 33 such as a mouse, for example.

The flow velocity measuring unit 47 has the function to calculate a flow velocity on a blood path based on a graph indicating a variation in signal intensity depending on the TI at each measuring position and distances between the measuring positions on a blood vessel acquired from the measuring position setting unit 46, and to display the calculated blood flow velocity on the display unit 34.

Figure 8:
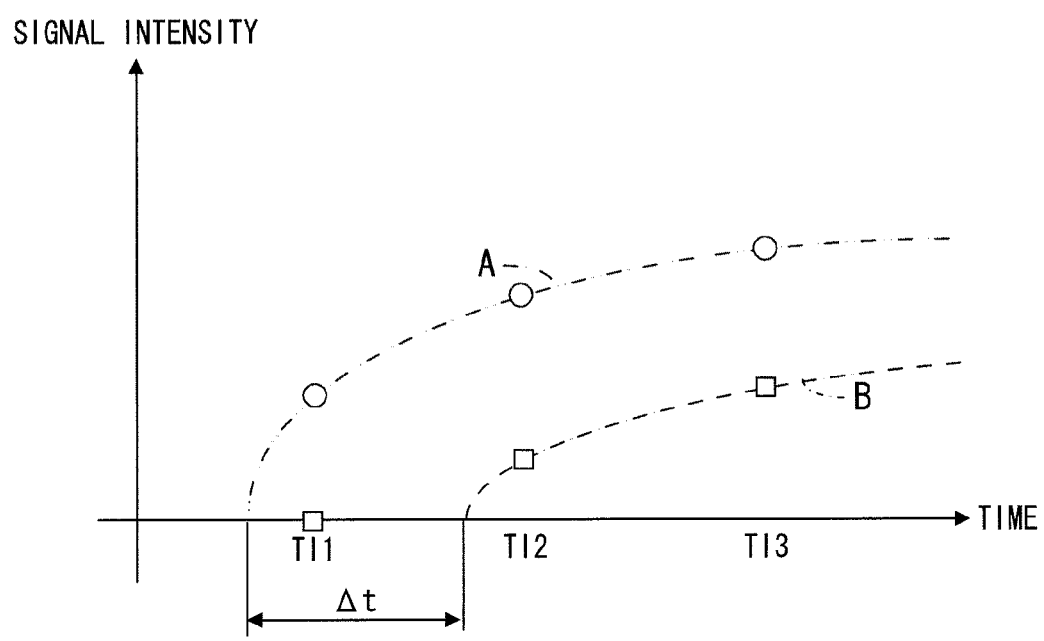
FIG. 8 is a graph derived by plotting time variations of signal intensities at the two measuring positions A and B on the blood flow image shown in FIG. 7.

FIG. 8 is a graph derived by plotting time variations of signal intensities at the two measuring positions A and B on the blood flow image shown in FIG. 7.

In FIG. 8, the abscissa axis denotes time and the ordinate axis denotes the signal intensities at the respective measuring positions A and B. As shown in FIG. 8, two measuring positions A and B show mutually different signal intensity changes by the T1 relaxation since the arrival times of the blood to the positions differ mutually. For example, the blood has reached the measuring position A on a blood flow image acquired by application of an IR pulse with a short TI1, and therefore, signals can be acquired, while the blood has not reached the measuring position B and therefore the signal intensity is zero.

In addition, due to the effect of the T1 relaxation, a signal can be acquired at the measuring position A on a blood flow image acquired by application of an IR pulse with a moderate TI2 with an intensity higher than that of a signal acquired at the measuring position A on the blood flow image acquired by application of the IR pulse with the short TI1. Meanwhile, a signal can be acquired at the measuring position B on the blood flow image acquired by application of the IR pulse with the moderate TI2 since the blood has reached there.

Moreover, signals are generated at the respective measuring positions A and B on a blood flow image acquired by application of an IR pulse with a long TI3 with intensities higher than those of the signals generated at the respective measuring positions A and B on each of the other blood flow images.

That is, as shown in FIG. 8, a time difference $\Delta t$ is generated between the plots showing the time variations of the signal intensities since the arrival times of the blood at the different measuring positions A and B mutually differs. The time difference $\Delta t$ can be calculated by cross-correlation between the data showing the time variation of the signal intensity at the measuring position A and that at the measuring position B.

Note that, data showing the time variation of the signal intensity at the measuring position A does not overlap with that at the measuring position B. For that reason, at least three signals with mutually different intensities are necessary to be acquired at a same measuring position in order to calculate the time difference $\Delta t$ by cross-correlation. This is why three mutually different TIs are necessary to be set. Even if signal intensities are null at some measuring positions, the time difference $\Delta t$ can be calculated by cross-correlation as long as a signal is acquired at another measuring point.

Meanwhile, the distance $\Delta l$ between the measuring positions A and B can be geometrically calculated based on 3D blood flow image data. For example, the distance $\Delta l$ can be measured simply on a 2D blood flow image for displaying. Then, the blood flow velocity v can be calculated by the formula (1).

$$v = \Delta l / \Delta t \qquad (1)$$

Specifically, the time difference $\Delta t$ in the signal intensity variations between the measuring positions A and B is regarded as equivalent to a period required for blood with a constant flow velocity to move between the measuring positions A and B. Therefore, an average blood flow velocity v in a traveling direction of a blood vessel can be calculated by dividing the distance $\Delta l$ between the measuring positions A and B by the time difference $\Delta t$ in the signal intensity variations between the measuring positions A and B. The blood flow velocity v calculated in the flow velocity measuring unit 47 as described above can be displayed on the display unit 34.

(Operation and Action)

Then, the operation and action of a magnetic resonance imaging apparatus 20 will be described.

Figure 9:
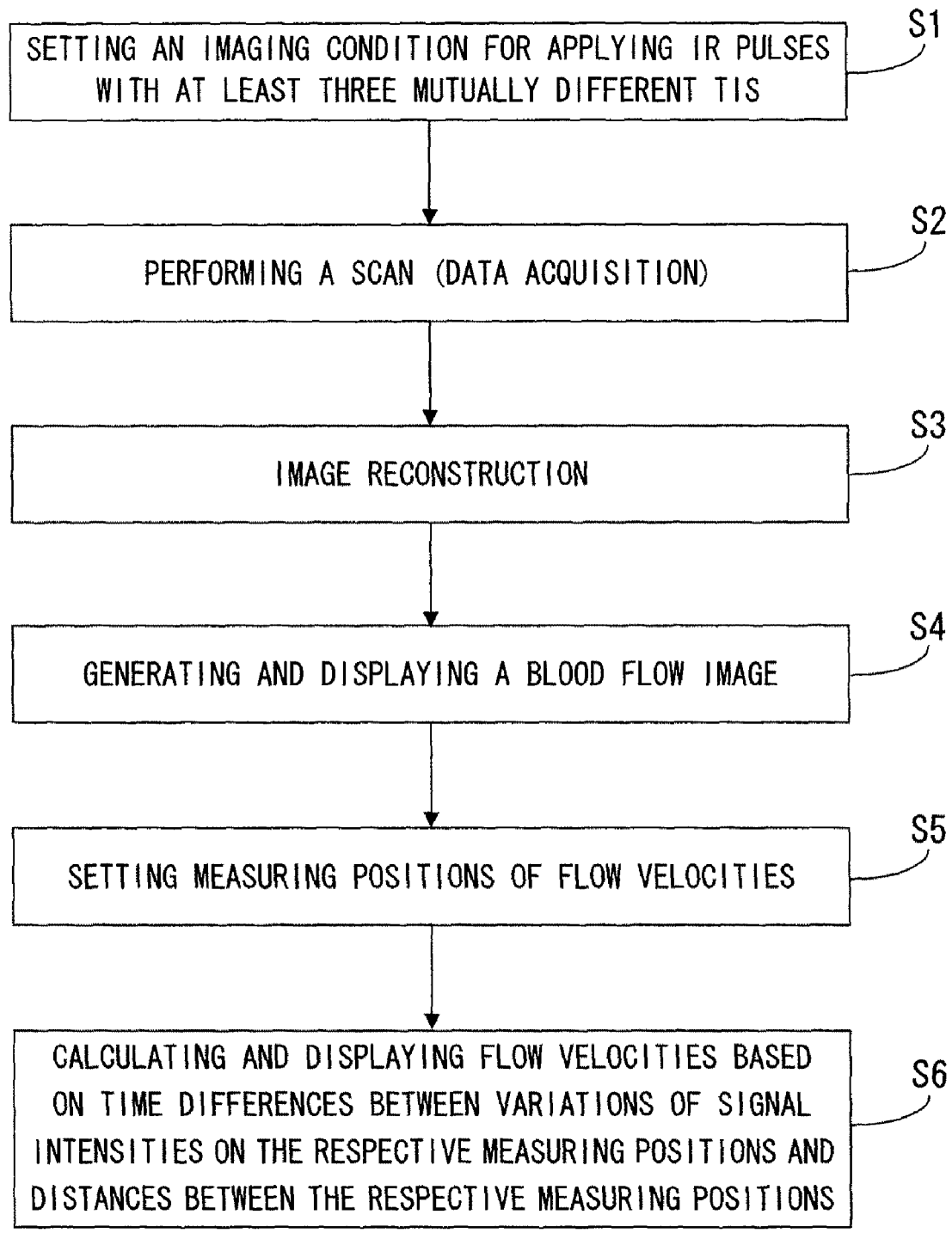
FIG. 9 is a flowchart showing a procedure for imaging a blood flow of the object to measure a blood flow velocity with the magnetic resonance imaging apparatus shown in FIG. 1.

FIG. 9 is a flowchart showing a procedure for imaging a blood flow of the object P to measure a blood flow velocity with the magnetic resonance imaging apparatus 20 shown in FIG. 1. The symbols each including S with a number in FIG. 9 indicate respective steps of the flowchart.

Firstly, in the step S1, a pulse sequence with applying at least three IR pulses having mutually different TIs is set as an imaging condition by the imaging condition setting unit 40.

Subsequently, in the step S2, data acquisition is performed according to the set imaging condition.

For that purpose, the object P is set to the bed 37, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

The input device 33 sends instruction for acquiring a blood flow image of a diagnostic part in the object P to the sequence controller control unit 41. The sequence controller control unit 41 supplies a sequence received from the imaging condition setting unit 40 to the sequence controller 31. Therefore, the sequence controller 31 drives the gradient power supply 27, the transmitter 29, and the receiver 30 in accordance with the pulse sequence received from the sequence controller control unit 41, thereby generating a gradient magnetic field at the imaging area having the set object P, and further generating RF signals from the RF coil 24.

Consequently, the RF coil 24 receives NMR signals generated due to nuclear magnetic resonance in the object P. Then, the receiver 30 receives the NMR signals from the RF coil 24 and generates raw data which is digital data of NMR signals by A/D conversion subsequently to necessary signal processing. The receiver 30 supplies the generated raw data to the sequence controller 31. The sequence controller 31 supplies the raw data to the sequence controller control unit 41. The sequence controller control unit 41 arranges the raw data as k-space data to the k space formed in the k-space database 42.

Subsequently, in the step S3, the image reconstruction unit 43 reads the k-space data from the k-space database 42 and performs image reconstruction processing of the read k-space data, thereby generating image data. The generated image data is written and stored in the image database 44.

Subsequently, in the step S4, the blood flow image generating unit 45 generates 2D or 3D blood flow image data and blood flow image data to be displayed by performing necessary image processing of the image data read form the image database 44. The generated blood flow image data is supplied to the display unit 34 so that a blood flow image is displayed on the display unit 34. As a result, at least three blood floe images corresponding to the respective TIs which are mutually different are displayed on the display unit 34.

Subsequently, in the step S5, a user references multiple blood flow images displayed on the display unit 34 and inputs positioning information into the measuring position setting unit 46 through the operation of the input device 33 such as a mouse. Subsequently, the user sets multiple spatial positions where the signal value is not zero on a blood vessel in at least a frame of blood flow image as measuring positions for a blood flow velocity. The information indicating the set measuring positions is provided to the flow velocity measuring unit 47 as polygonal line information or point group information.

Next in the step S6, the flow velocity measuring unit 47 calculates a blood flow velocity based on distances between the measuring positions in the blood vessel acquired from the measuring position setting unit 46 and a graph showing signal intensity variations depending on the TIs at the respective measuring positions. The distance between the measuring positions on the blood vessel can be geometrically calculated from the blood flow image data. In addition, a time differences between multiple plots showing time variations of signal intensities according to the mutually different TIs at the respective measuring positions is calculated by cross-correlation between the multiple plots. Then, an average blood flow velocity can be calculated by dividing the distance between the measuring positions on the blood vessel by the calculated time difference.

The blood flow velocity calculated in this way is displayed on the display unit 34. Consequently, the user can confirm a fluid velocity.

That is, the foregoing magnetic resonance imaging apparatus 20 is an apparatus to perform MRA imaging in accordance with pulse sequences with application of IR pulses with at least three mutually different TIs and calculate a blood flow velocity based on both a time difference between pieces of time variation data of signal intensities according to the respective TIs at plural measuring positions set on acquired blood flow image data and a distance between the respective measuring positions. In other words, a blood flow velocity can be measured based on a difference in an extracted state of a blood flow signal that changes in response to a different TI.

(Effect)

Accordingly, it is possible to obtain and display a flow velocity of fluid such as blood flow more easily in a shorter time by the magnetic resonance imaging apparatus 20.

What is claimed is:

1. A magnetic resonance imaging apparatus comprising:
   a fluid image data acquisition unit configured to acquire plural pieces of fluid image data from an object by imaging with applying at least three inversion recovery pulses having mutually different inversion times, the plural pieces of the fluid image data corresponding to the inversion times; and
   a flow velocity measuring unit configured to obtain a flow velocity of fluid based on time variation of a signal intensity depending on the inversion times at each of plural positions set in at least one of the plural pieces of the fluid image data and a distance between the plural positions.

2. A magnetic resonance imaging apparatus of claim 1, wherein said fluid image data acquisition unit is configured to acquire plural pieces of blood flow image data as the plural pieces of the fluid image data.

3. A magnetic resonance imaging apparatus of claim 1, wherein said fluid image data acquisition unit is configured to acquire plural pieces of non-contrast-enhanced blood flow image data as the plural pieces of the fluid image data by a spin echo sequence.

4. A magnetic resonance imaging apparatus of claim 1, wherein said fluid image data acquisition unit is configured to acquire plural pieces of contrast-enhanced blood flow image data as the plural pieces of the fluid image data by a field echo sequence.

5. A magnetic resonance imaging apparatus of claim 1, further comprising:
   a setting unit configured to set a desired inversion time based on the plural pieces of the fluid image data corresponding to the inversion times; and
   an imaging unit configured to acquire image data by imaging under an inversion recovery method according to the desired inversion time as an imaging condition.

6. A magnetic resonance imaging apparatus of claim 1, further comprising:
   a setting unit configured to set a desired inversion time based on the plural pieces of the fluid image data corresponding to the inversion times; and
   an imaging unit configured to acquire image data by imaging with a Time Spatial Labeling Inversion Pulse sequence according to the desired inversion time as an imaging condition.

7. A magnetic resonance imaging apparatus of claim 1, further comprising:
   an imaging unit configured to acquire image data by imaging with a Time Spatial Labeling Inversion Pulse sequence according to the flow velocity of the fluid as an imaging condition.

8. A magnetic resonance imaging apparatus of claim 1, wherein said flow velocity measuring unit is configured to obtain an average velocity of the fluid on a path of the fluid.

9. A magnetic resonance imaging apparatus of claim 1, wherein said fluid image data acquisition unit is configured to acquire plural pieces of blood flow image data with tagging blood flow by applying region-selective inversion recovery pulses in a region including a upstream blood vessel of a target blood vessel.

10. A magnetic resonance imaging apparatus of claim 5, wherein said fluid image data acquisition unit is configured to acquire plural pieces of two-dimensional fluid image data.

11. A magnetic resonance imaging apparatus of claim 6, wherein said fluid image data acquisition unit is configured to acquire plural pieces of two-dimensional fluid image data.

12. A magnetic resonance imaging apparatus of claim 7, wherein said fluid image data acquisition unit is configured to acquire plural pieces of two-dimensional fluid image data.

13. A magnetic resonance imaging method comprising:
acquiring plural pieces of fluid image data from an object by imaging with applying at least three inversion recovery pulses having mutually different inversion times, the plural pieces of the fluid image data corresponding to the inversion times; and obtaining a flow velocity of fluid based on time variation of a signal intensity depending on the inversion times at each of plural positions set in at least one of the plural pieces of the fluid image data and a distance between the plural positions.

* * * * *